United States Patent [19]

Kaneko et al.

[11] Patent Number: 4,539,647
[45] Date of Patent: Sep. 3, 1985

[54] METHOD OF AND APPARATUS FOR IDENTIFYING PRESENSITIZED OFFSET PRINTING PLATES

[75] Inventors: Sinobu Kaneko; Hiroyuki Nakade, both of Osaka, Japan

[73] Assignee: Kotobuki Seihan Printing Co., Ltd., Osaka, Japan

[21] Appl. No.: 418,037

[22] Filed: Sep. 14, 1982

[30] Foreign Application Priority Data

Sep. 17, 1981 [JP]  Japan .................. 56-146872

[51] Int. Cl.³ ............................................ G02F 3/46
[52] U.S. Cl. .................................. 364/526; 364/551
[58] Field of Search .................. 250/226; 355/38; 356/404, 407, 425; 358/78, 80; 364/519, 525, 526, 551, 554, 571

[56] References Cited

U.S. PATENT DOCUMENTS

| Re. 28,771 | 4/1976 | Aimi et al. ............. 355/38 X |
| 3,433,938 | 3/1969 | Johnson ................ 364/554 X |
| 3,891,317 | 6/1975 | Walker ................... 355/38 X |
| 4,090,243 | 5/1978 | Kotera et al. ............. 364/526 |
| 4,150,894 | 4/1979 | Meyer et al. ............... 355/38 |
| 4,183,665 | 1/1980 | Iannadrea et al. ........... 356/71 |
| 4,225,242 | 9/1980 | Lane ....................... 356/407 |
| 4,239,393 | 12/1980 | Tobias ..................... 356/407 |
| 4,264,196 | 4/1981 | von Stein et al. ........ 355/38 X |
| 4,299,479 | 11/1981 | Harvey et al. ............. 355/38 |
| 4,448,521 | 5/1984 | Shiota .................. 355/38 X |

Primary Examiner—Errol A. Krass
Assistant Examiner—Edward R. Cosimano
Attorney, Agent, or Firm—Armstrong, Nikaido, Marmelstein & Kubovcik

[57] ABSTRACT

A presensitized offset printing plate is identified by its reflected light as one of the known presensitized plates of different light reflective characteristics. White light is casted on a freshly introduced presensitized plate to be tested so as to measure the intensity of the reflected light from the surface of the photosensitive layer thereon in four color signals, which are a magenta signal, yellow signal, cyan signal and black-and-white signal. Then the reflected light is compared in each color signal with the reference data which are inherently determined with respect to known presensitized plates of different light reflective characteristics, whereby the tested presensitized plate is recognized or identified as one of the known presensitized plates. Said reference data, which are different with respect to the known plates, are stored in memory means. In the case of the reference data characteristic of the known plate being not available for the identification, the light reflective characteristics of the known plate can be detected and stored in said memory means for subsequent identification procedures.

2 Claims, 14 Drawing Figures

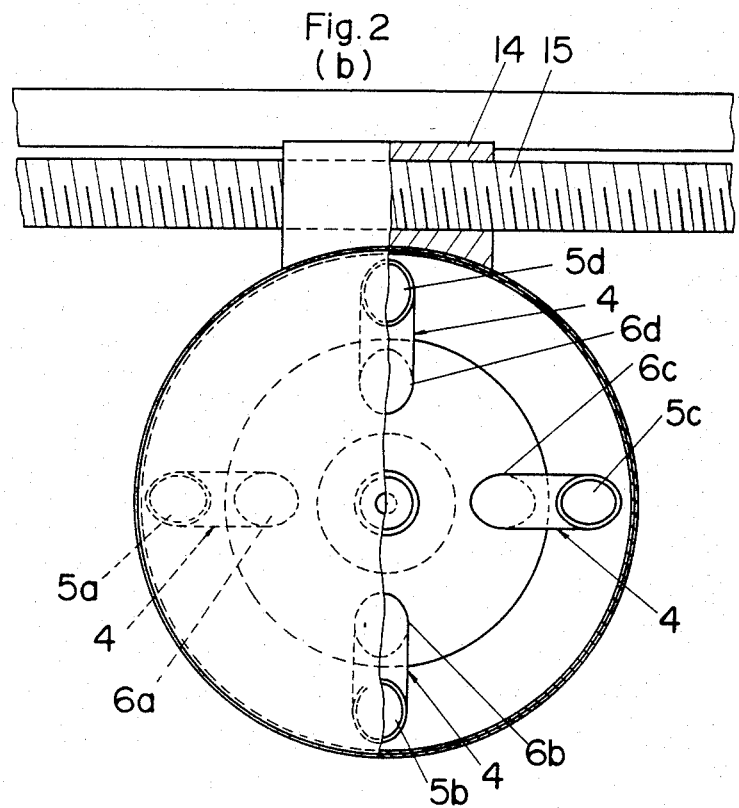
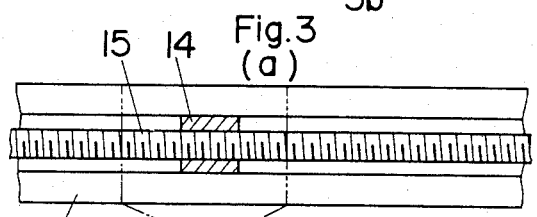
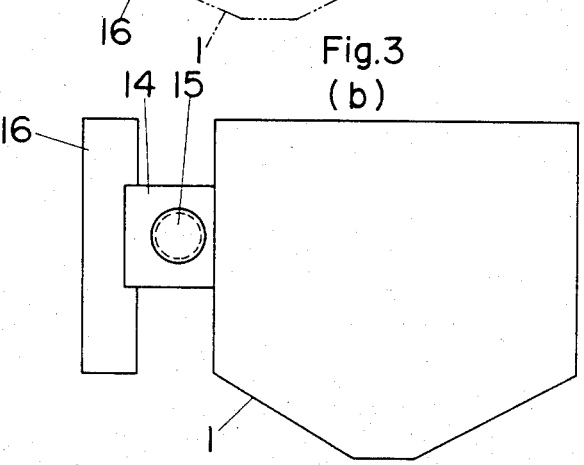

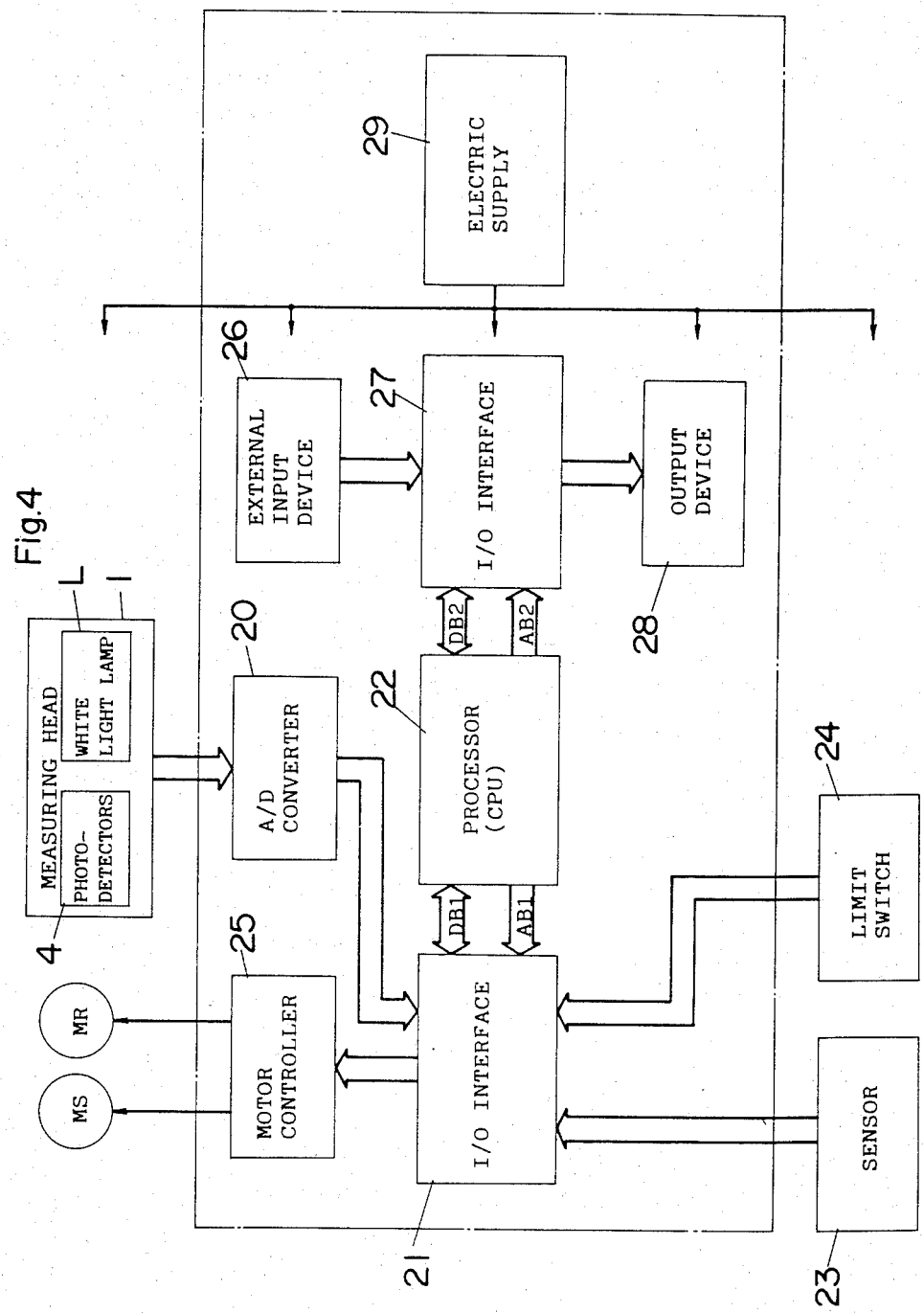

METHOD OF AND APPARATUS FOR IDENTIFYING PRESENSITIZED OFFSET PRINTING PLATES

BACKGROUND OF THE INVENTION

1. Fields of the Invention

This invention is directed to a method of and apparatus for identifying presensitized offset printing plates having thereon photosensitive layers of different light reflective characteristics, more particularly to a method of and apparatus for identifying the printing plate by examining the light reflectances from the photosensitive layer thereon in four colors.

2. Description of the Prior Art

There have been provided on the market various kinds of presensitized offset printing plates which require different developing procedures. These presensitized plates, generally composed of an aluminium-made substrate and a photosensitive layer made of a suitable diazo compound, are mainly classified into two types, one (negative-type) for using a negative master transparency and the other (positive-type) for using a positive master transparency. These plates normally have the photosensitive layer of nearly the same color, say grayish blue or grayish green, so that the distinction between these two types is hardly expected with the naked eye. In view of this, there have been conventionally employed for automatic development systems a method of identifying the presensitized plates only by detecting the average luminosity or brightness (intensity of black-and-white component) in the reflected light from the photosensitive layer. However, in addition to the printing plates being classified into two basic types, the printing plates in each type are further classified into different types depending on different manufacturers and/or specific purposes, and these plates in each basic type exhibit almost the same color representations so that the distinction by such conventional method between these plates are made much more difficult. For example, spectrum reflectances of several types of commercially available presensitized plates are illustrated in FIG. 1, wherein curves indicated by N-1, N-2, P-1, P-2 and P-3 correspond respectively to the negative-type presensitized plate sold under the tradename of SGN manufactured by Konishiroku Photo Industry Co., Ltd., Japan, the negative-type plate sold under the tradename of GAN manufactured by Fuji Photo Film Co., Ltd., Japan, the positive-type plate sold under the tradename of GAP manufactured by Fuji Photo Film Co., Ltd., the positive-type plate sold under the tradename of SGP manufactured by Konishiroku Photo Industry Co., Ltd. and the positive-type plate sold under the tradename of LKP manufactured by Fuji Pharmaceutical Co., Ltd., Japan. As shown in FIG. 1, the light reflective characteristics of these plates resemble closely with each other, particularly between the plates N-1 and N-2 as well as between the plates P-1 and P-2, from which it is suggested that, even if the distinction between the negative-type and positive-type can be made by the use of the above method which detects an average luminosity of the plate, the distinction among the plates in each type is almost impossible by the same method. Accordingly, an optimum developing procedure suitable for a plate of specific type is hardly to be obtained with this method, which would sometimes lead to undesirable development of the printing plate. This means that such conventional method is no more effective for determining exactly a specific type of or identifying the presensitized plates of different types which have nearly the same light reflective characteristics but require different developing procedures.

SUMMARY OF THE INVENTION

The above uncertainty in discriminating among several types of the presensitized printing plates has been solved by the present invention which is characterized in that the presensitized plates are examined with respect to their light reflective characteristics in four colors. A fresh presensitized plate to be tested for determining exposure and/or developing condition is introduced to a detecting station, where it is illuminated with a white light in order to detect and measure the intensity levels of the light reflected from the photosensitive layer thereon in four color signals of a magenta signal, yellow signal, cyan signal and black-and-white signal. The intensity level of the reflected light is measured from a plurality of spots on the presensitized plate so as to obtain mean and variance values of the intensity level with respect to each color. Then, the measured mean and variance values are incorporated with those which have been obtained as reference data with respect to each color for each of known presensitized plates of different types in order to obtain correlation ratios with respect to each color for the corresponding numbers of groups consisting of the test plate and each reference plate. Further, the variance ratios with respect to four colors for each group are added to get a respective sum as a comparison criterion among the groups in order to compare the individual sums with each other and find a group of a minimum value. The group found to have a minimum value of the sum of the correlation ratios is therefore determined by analysis of variance with data corresponding to two identical plates of the same light reflective characteristics over the wide range of wavelength, from which the test plate is judged to be identified as a specific plate among reference plates of different types. It is therefore a primary object of the present invention to provide a method of identifying the presensitized offset printing plates which is capable of judging exactly the type of a fresh presensitized plate to be tested so as to determine an exact development condition.

The above comparison or judgement is made by a microprocessor including memory means which stores the data with regard to each of the reference presensitized plates and to which fresh data can be entered by the use of the same detecting means so as to accumulate information for use in subsequent identification procedures. Accordingly, another object of the present invention is to provide an apparatus for identifying the presensitized offset printing plates which is capable of incorporating newly obtained data into the stored data for increasing the accuracy in identifying presensitized plates. Still further advantages and characteristics of the invention are depicted in the claims and the following detailed description, explaining preferred embodiments by way of example only.

BRIEF DESCRIPTION OF THE DRAWINGS

In the drawings,

FIG. 2(a) is an enlarged vertical section showing a measuring head employed for detecting the reflected light in four colors in the present invention;

FIG. 3(a) is a fragmentary elevational view showing a guide rail employed for movably supporting the measuring head;

FIG. 3(b) is a fragmentary side view showing the above guide rail;

FIG. 4 is a block diagram embodying the present invention;

DETAILED DESCRIPTION OF THE PREFERRED EMBODIMENTS

Figure 1:
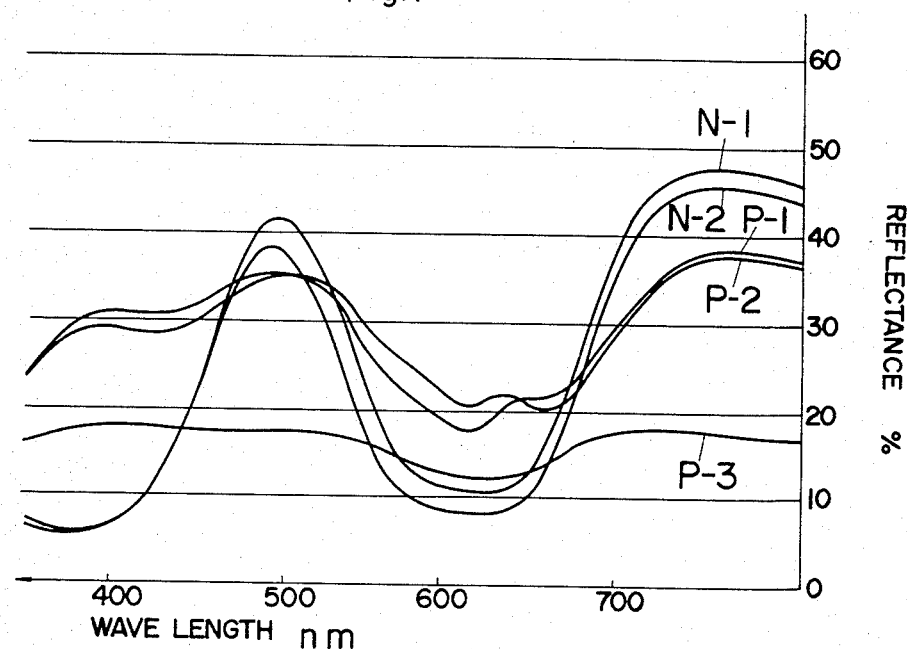
FIG. 1 is a graphical representation illustrating the reflectance values of several presensitized offset printing plates of different light reflective characteristics.
Figure 2:
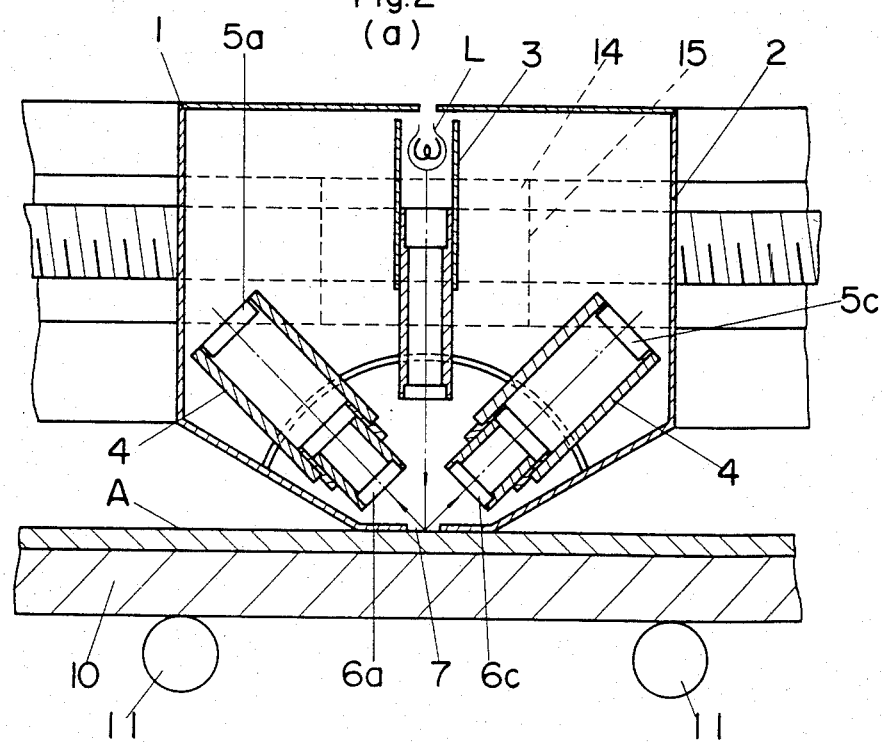
FIG. 2 (b) is an enlarged top view partly in cross section showing the measuring head shown in FIG. 2(a)

Referring now to FIGS. 2(a) and 2(b), there is illustrated a measuring head 1 employed in the preferred embodiment of the present invention. This measuring head 1 comprises a casing 2 having therein a light emitter 3 with a white light lamp L and four detecting means 4, the light emitter 3 being disposed with its lower end directed to a bottom aperture 7 of the casing 2 and the detecting means 4 being circumferentially spaced apart at regular intervals around the light emitter 3 with their optical axes crossed at about 45 degrees with respect to the optical axis of the light emitter 3. Three of these detecting means 4 have at their respective upper ends photodetectors 5a, 5b, and 5c together with color filters 6a, 6b, and 6c at their respective lower ends, and the fourth one has at its upper end a photodetector 5d, all the lower ends of the detecting means 4 being directed and closely adjacent to said aperture 7 for receiving the light reflected therethrough. These color filters 6a, 6b and 6c are respectively those sold under the tradenames of Wratten No. 25, No. 47 and No. 58 by Eastman Kodak Company such that the corresponding photodetectors 5a, 5b and 5c receive respective color components, i.e., cyan, magenta and yellow, while the fourth photodetector 5d without color filter receives a black and white component of the light, each photodetector producing an output which varies in accordance with the intensity of each color signal received. The measuring head 1 is located above a tray 10 with its bottom aperture 7 maintained closely adjacent to a presensitized offset printing plate A (hereinafter referred to as PS plate A) introduced on the tray 10 in such a way as to illuminate through the aperture 7 the spots on the PS plate A with the white light as well as to receive the light reflected by the spots with the individual photodetectors 5a, 5b, 5c, and 5d. That is, the above four detecting means 4 are tilted so as to have on the surface of the PS plate A an intersection point of their individual axes with the optical axis of the light emitter 3. The tray 10, for receiving and transferring the PS plate A, is slidably supported by roller means 11 in order to reciprocate it between a detecting station 32 and an exposure station 31 where the identified PS plate A is exposed with a negative or positive master transparency. Attached to the side of the measuring head 1 is a slider 14 which is threaded on a threaded shaft 15 extending horizontally, as shown in FIGS. 3(a) and 3(b). The slider 14 is also slidably engaged at its outer portion with a guide rail 16 so as to slidably support the mesuring head 1 by the shaft 15 and the rail 16. The threaded shaft 15 is driven by motor means MS in order to move the measuring head 1 back and forth horizontally in a limited path, effectuating the scanning operation of the measuring head 1 along a scanned path on the PS plate A, the scanned path being practically in a non-picture area on the periphery of the PS plate.

Figure 11:
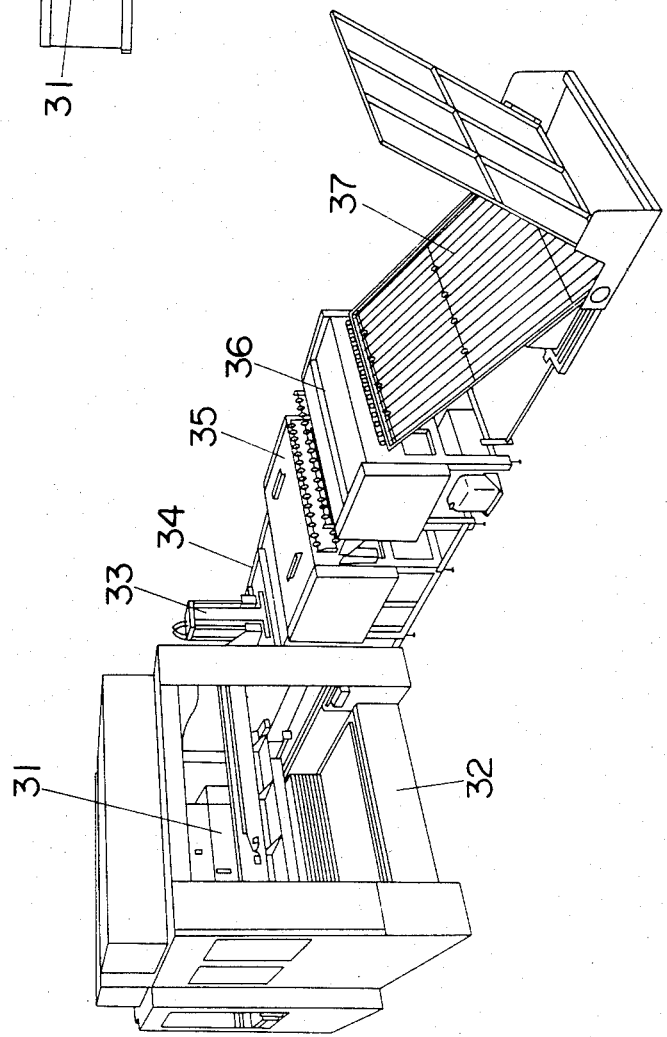
FIG. 11 is a perspective view showing the automatic developing system which incorporates the apparatus of the present invention.

A system constructed and operative according to the present invention is illustrated in FIG. 4. As shown, the output of each of said photodetectors 4 is applied to an A/D converter 20 where it is converted into a corresponding digital signal, which is then fed via an I/0 interface 21 and a data bus DB1 to a microprocessor 22 or central processing unit CPU including memory means. The numeral 23 designates a sensor for judging whether the PS plate is set in a proper position on said detecting station 32. The output of this sensor 23 is transmitted as an input via the I/O interface 21 to the processor 22 which thereafter transmits a corresponding output via the I/O interface 21 by the function of an address bus AB1 to a motor controller 25 for operating motor means MR and MS. The motor means MR is operatively connected to said roller means 11 for positioning said PS plate A on the tray 10 and is controlled by the motor controller 25 in response to the output from the sensor 23 so as to set the PS plate in a proper position. The motor means MS is operatively connected to said threaded shaft 15 and is controlled by the motor controller 25 to provide the scanning operation with said measuring head 1 when the PS plate is judged by the sensor 23 to be set in a proper position. Also operably connected via the I/O interface 21 to the processor 22 is a limit switch 24 which detects both end limits of linear reciprocating scanning movement of the measuring head 1 and thus controls the starting, reversing and stopping operations of the head 1 in accordance with the corresponding output from the processor 22. The above processor 22 is further operably connected via an I/O intereface 27 to an external input device 26 which is a keyboard for feeding data to the processor 22 therefrom as well as being operably connected to an output device 28 including a CRT display, printer and output circuit which is used to transmit an output in accordance with the operation of the processor 22 to these peripherals to be controlled, which are in practice the processing units employed respectively in exposure station 31 and/or developing station 35 as illustrated in FIG. 11. Said I/O interface 27 is operatively connected by means of a data bus DB2 and an address bus AB2.

The numeral 29 designates an electric supply for the above components.

Figure 5:
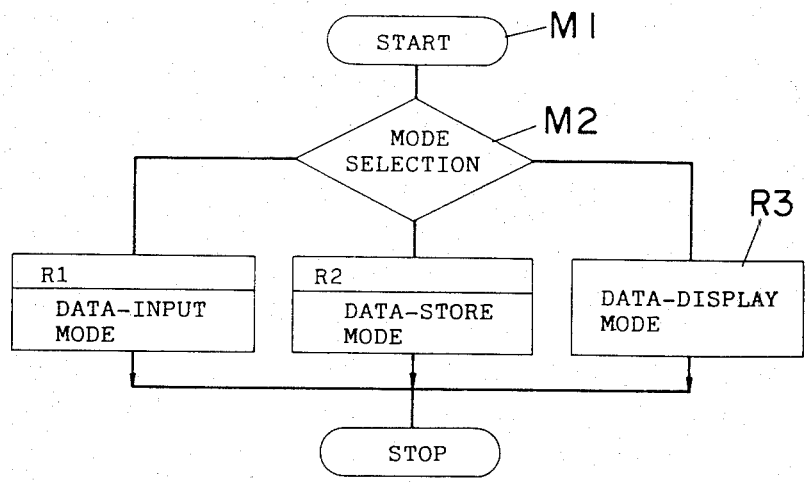
FIG. 5 shows the operating sequence of a main program for entering the data designating a specific presensitized plate in accordance with the present invention.
Figure 6:
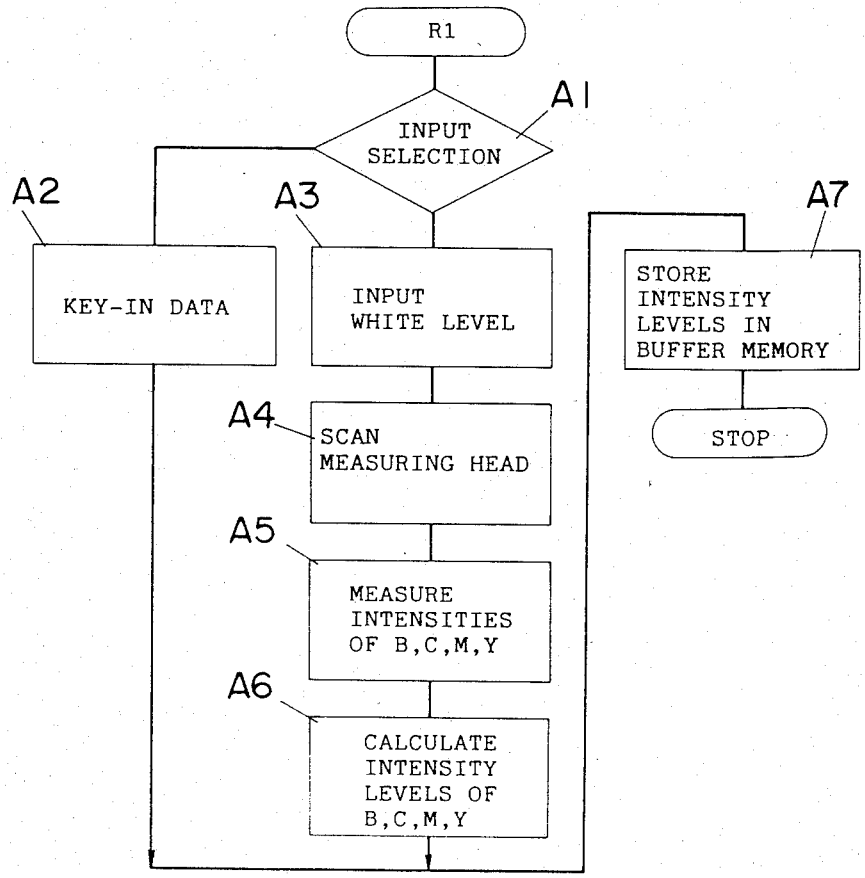
FIG. 6 shows the operating sequence of the routine constructing the data-input mode constructing the main program of FIG. 5.
Figure 7:
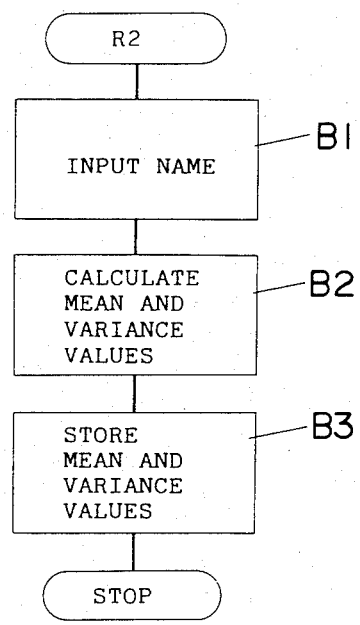
FIG. 7 shows the operating sequence of the routine constructing the data store mode constructing the main program of FIG. 5.

Turning now to FIGS. 5 to 7, flow diagrams are shown for an exemplary operating sequence for entering reference data of a known PS plate, wherein FIG. 5 illustrates a main program and FIGS. 6 and 7 illustrate respective routines utilized in the main program. After the start of the operation (step M1), the processor 22, in accordance with the program stored in the memory, produces the output to the output device 28 in order to display on the CRT display the contents of a mode-selection menu which are data-input, data-store and data-display modes as well as to ask an operator to enter one of these modes with the keyboard in a mode-selection step M2. When the data-input mode R1 is selected, the processor 22 responds by executing a related routine to advance the operating sequence to an input-selection step A1 as shown in FIG. 6 and then asks as to whether the data is entered by using the same key board or by scanning the measuring head 1. When the selection is made for the scanning function of the measuring head 1 at the step A1 by entering the word "HEAD" with the keyboard, the processor 22 goes through steps A3 through A6 in order to obtain the reference data characteristic to a fresh PS plate introduced on the tray 10 as a standard one. These and following operations are conducted with respect to other known PS plates of different types. In the step A3, the processor 22 requires a white board to be set on the tray 10 for the purpose of measuring the white level of the reflected light therefrom by using said white lamp L and four detecting means 4, the resulting white level being stored for evaluating relative intensity thereto of each color detected in the following steps. In the step A4, the processor 22 requires a reference PS plate to be set on the tray 10, and upon recognition of the plate being set in the proper position it cause the white lamp L to light and the measuring head 1 to perform the scanning operation. In response to the instructions by the processor 22, the measuring head 1 moves along the scanned path on the periphery of the PS plate so as to measure the intensity in each color of the light reflected by the PS plate at each point on the scanned path. Each intensity with respect to each color component measured by the corresponding photodetector is stored in a buffer memory in the step A5. Next, in the step A6, the processor 22 reads the data stored in a buffer memory in the steps A3 so as to calculate an intensity level of each color with respect to said white level, that is, the black intensity level B which is the ratio of black-and-white color intensity to white level, cyan intensity level C which is the ratio of cyan color intensity to white level, magenta intensity level M which is the ratio of magenta color intensity to white level, and yellow intensity level Y which is the ratio of yellow color intensity to white level. These intensity levels B, C, M and Y, which correspond to reflectance with respect to four colors, are stored in the buffer memory in a step A7 to complete the data-input mode. While on the other hand, when the selection is made at the step A1 by entering the word "KEY" with the keyboard, the program will jump to a key-in data step A2 in which the operator can enter the reference data of known PS plates with the keyboard in accordance with the entry order which appears by the function of a monitor program on the CRT display. The reference data are the relative intensities or reflectances of cyan color component, magenta color component, yellow color component, and black-and-white color component, which correspond respectively to the mean values and the variance values of these intensity levels with respect to all four colors which correspond respectively to those obtained in a following step B2 described below, these reference data being stored in the buffer memory to complete this data-input mode. After the completion of this mode, the program will return to the mode-selection step M2 in which the processor 22 again asks the operator to select one mode among the three. In this connection, the operator must select the data-store mode R2 to proceed in the operating sequence to an input name step B1 in which the processor 22 asks the operator to enter specific code names such as tradename, plate No. and the like for the PS plate employed as a reference one in the previous data-input mode R1, in response to which the key-in operation is made for designating the PS plate employed. When the above data-input mode R1 has been conducted by using the measuring head 1, the operating sequence advances to the calculating step B2, in which the processor 22 is operative to calculate with respect to each color component the mean value together with the variance value of the intensities measured and stored in the above step A7 and thereafter advances to a storing step B3. When the above described data-input has been conducted with the keyboard as in the above step A2, the operating sequence jumps from the step B1 to the storing step B3, in which the mean and variance values calculated or inputted with respect to all four colors are stored as one set of reference data characteristic to this reference PS plate in data memory means to complete this data-store mode. Accordingly, the one cycle of the operating sequence for entering the one set of reference data with respect to one PS plate is completed such that the apparatus can then be ready for subsequent data-input procedures to gather another set of reference data for a different PS plate, or for an operating sequence of identifying unknown PS plates, which will be hereinafter described in detail. The remaining data-display mode R3 is provided for displaying the data stored in the buffer memory or the data memory, and has a routine, not illustrated, comprising the steps of selecting an output device to be operated from the CRT display and the printer, selecting the data to be displayed from between the buffer memory and the data memory and driving a selected device to write a selected data therewith. These data derived from the output device are available for reentering them in the data memory means when the stored memory inadvertently disappears.

Figure 8:
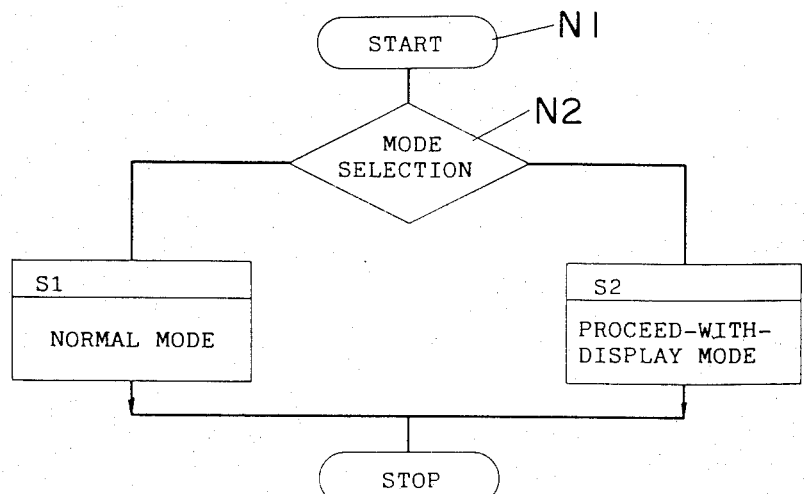
FIG. 8 shows the operating sequence of a main program for identifying a presensitized plate in accordance with the present invention.
Figure 10:
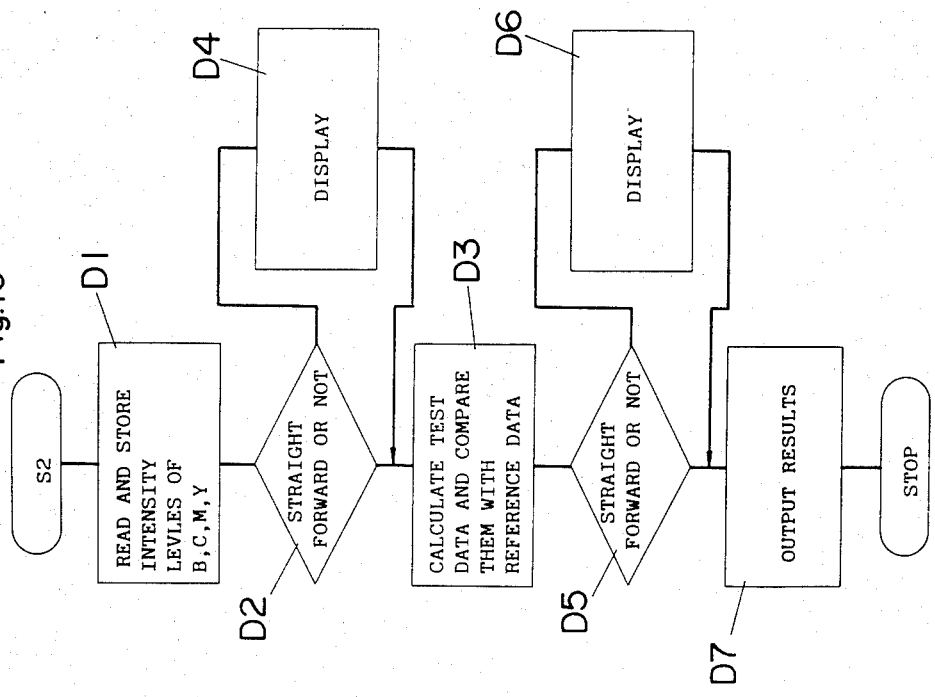
FIG. 10 shows the operating sequence of the routine constructing the proceed-with-display mode constructing the main program of FIG. 8.
Figure 9:
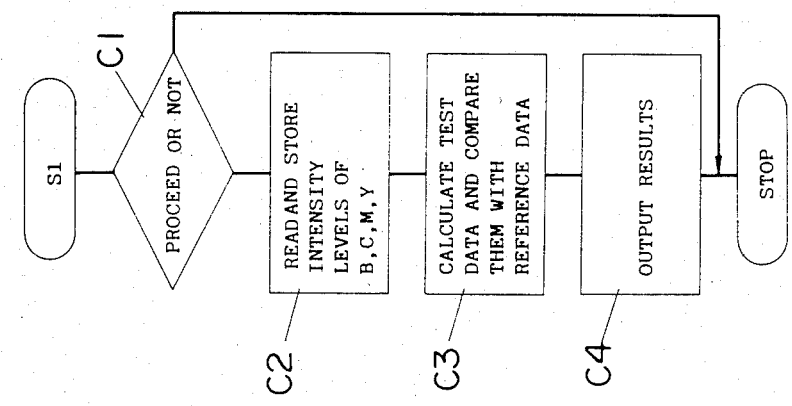
FIG. 9 shows the operating sequence of the routine constructing the normal mode constructing the main program of FIG. 8.

Turning now to FIGS. 8 to 10, flow diagrams are shown for an exemplary operating sequence for identifying a freshly introduced PS plate of unknown characteristics, wherein FIG. 8 illustrates a main program and FIGS. 9 and 10 illustrate respective routines utilized in the main program. After the start of the operation by depressing the keys on the keyboard 26 designating the identifying function in a step N1, the processor 22, in response to such command, makes an inquiry on the CRT display as to whether a normal mode S1 or a proceed-with-display mode S2 is to be selected in a mode-selection step N2. When the normal mode S1 is selected by the key-in operation in accordance with this inquiry, the operational sequence jumps to a step C1 at the beginning of the corresponding routine. In the step C1, the processor 22 asks the operator to enter the command for proceeding the sequence (YES) or quitting it (NO). Upon receipt of the YES command, the processor 22 operates to transfer the PS plate introduced on said tray 10 to the position just below the measuring head 1 by producing an output to said motor controller 25 so as to operate said motor means MR for driving said roller 11 carrying said tray 10. After the recognition with said sensor 23 is made that the PS plate is transferred into a proper position in the detecting station 32, the processor 22 responds to produce a control signal to said motor controller 25 so as to drive the motor means MS. Thus, the measuring head 1 is moved horizontally by means of said threaded shaft 15 for scanning operation. During this horizontal movement of the head 1, the processor 22 causes each photodetector 4 to receive an intensity of the reflected light in each color at each preselected spot on the scanned path, these intensities obtained from a plurality of spots on the PS plate being compared with the white level to calculate the respective intensity levels or reflectances as in the same manner in the step A7 and stored in the buffer memory in a step C2. The above movement of the head 1 is controlled by said limit switch 24 such that the head 1 moves back to the initial position after the completion of the scanning operation in one direction along a path of predetermined length. The individual intensity levels measured in each color from a plurality of spots are calculated in a logic step C3 to give, with respect to each color component, a mean value as well as a variation value thereof, which values are used as test data in the following procedures. In the same step C3, the processor 22 operates to read the reference data from the data memory means for comparing by analysis of variance method said test data with the reference data, such that the test plate can be identified as one of the reference plates. Firstly, the test data is combined with one set of the reference data to form a group for which correlation ratios with respect to four colors are to be calculated from the mean and variance values both for the test and reference data in accordance with formulae described more fully below. The same operation is conducted with each remaining set of reference data to get the corresponding numbers of the groups for which respective correlation ratios are to be calculated. Brief description of the calculation for obtaining the above correlation ratio will be made herein.

Let the mean value of the reference data with respect to each color be $B(p,t)$, let the variance value of the same be $C(p,t)$, let the mean value of the test data with respect to each color be $E(p)$, and let the variance value of the same be $D(p)$ where p is the number of the color channels and t the number of sets of the reference data or the number of the reference plates.

Then, the total mean value $F(p,t)$, which is the value falling between the mean values for the test and reference data, can be represented by the equation $$F(p,t) = \tfrac{1}{2}\{B(p,t) + E(p)\} \quad (1)$$

and the total variance value $G(p,t)$ can be represented by the equation $$G(p,t) = \tfrac{1}{2}\{C(p,t) + D(p)\} + \tfrac{1}{2}[\{B(p,t) - F(p,t)\}^2 + \{D(p) - F(p,t)\}^2] \quad (2)$$

Accordingly, the correlation ration can be represented from the equations (1) and (2) by the formula $$\eta(p,t) = \frac{\tfrac{1}{2}\{\{B(p,t) - F(p,t)\}^2 + \{D(p) - F(p,t)\}^2\}}{G(p,t)}$$

Now turning back to the step C3, the processor 22, after calculating the correlation ratios with respect to four colors for each of the groups, succeedingly operates to add the correlation ratios of four colors within each group in order to find among said groups a group having the sum of a minimum value. Then, the processor 22 can estimate that there is no significant difference between the test data and the reference data within the group of a minimum value of the sum, with the result that, the test plates can be judged to be identified as one of the reference plates which forms with the test plate said group of the minimum value. When the test plate is judged to be classified as one of the known reference plates, the processor 22 is operative in an output step C4, to produce an output to the output device 28 for indicating the code names of this test plate by displaying it on the CRT display and/or by printing it on a paper with the printer, completing the normal mode S1 of the identification procedure. Such information showing the kind of the PS plate is most useful in deciding in the subsequent procedures the correct time required for exposure and for developing, a correct developing agent and the like. Further, the output in the step C4 may be optionally fed to said output circuit which in turn produces a corresponding control output to the exposing unit and/or developing unit for attaining an automatic processing of the PS plate from the exposure to developing procedures, the detail discussion of which will be made later.

Returning to the step N2 in FIG. 8, there is an alternative selection for a proceed-with-display mode S2 which is initiated by entering the command designating such mode. The entry of this command triggers the routine of FIG. 10 which starts by the step D1 which is the same procedure as described in the preceding step C2. After reading the intensity levels of the reflected light in each color from a plurality of spots on the PS plate, the processor 22 asks the operator, in a step D2, which fuction is to be selected, either one for proceeding directly to the logic step D3 which has the same operation as in the preceeding step C3, or the other for proceeding via a display step D4 to the logic step D3. The former function is set by entering the command "YES" and the latter is selected by entering the command "NO", in which case the operating sequence advances to the step D3 after displaying on the CRT display the data measured and stored in the buffer memory in the step D1. After the calculation is made in the step D3, the processor 22 further asks the operator in a step D5 which function is to be selected, either one for proceeding by entering the command "YES" directly to the output step D7 which has the same operation as in the preceding step C4 or the other for proceeding by entering the command "NO" via a display step D6 to the output step D7. In the step D4, the test data obtained in the step D3, i.e., the mean and variance values of the reflectance with respect to all four color components are displayed on the CRT display. The above described proceed-with-display mode is completed by the operation in the output step D7 and the operating sequence goes back to the mode selection step S2 in FIG. 8.

Figure 12:
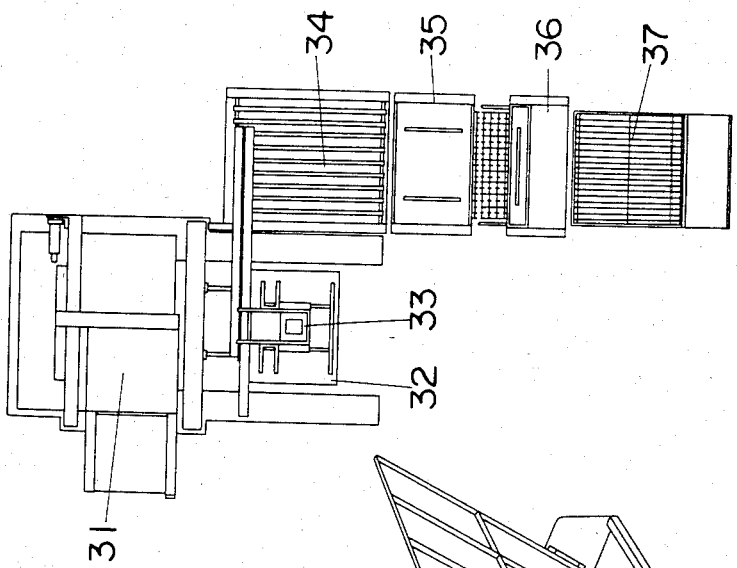
FIG. 12 is a top view showing the above automatic developing system with the top cover removed.

Referring now to FIGS. 11 and 12, there is shown an automatic exposure and developing system for a PS plate into which the apparatus of the present invention is incorporated. The system is basically composed of the exposure station 31, developing station 35 and detecting station 32 interposed therebetween. The detecting station 32 is provided with said tray 10, roller 11 and motor means MR which operate in response to the output signals from the processor 22 for bringing the PS plate into a proper position as well as for carrying the PS plate between the detecting station 32 and the station 31. Also provided in the detecting station 32 is a transferring device 33 which is capable of catching the PS plate by vacuum suction and is arranged to move vertically as well as laterally for transferring the PS plate from on the tray 10 to a roller conveyer 34 adjacent to the developing station 35, this transferring device 33 having said measuring head 1, threaded shaft 15, guide rail 16 and the motor means MS therein. The developing station 35 is provided with two parallel tanks each storing different developing agent, one for the negative-type PS plate and the other for the positive-type PS plate, so that the PS plate identified in the detecting station 32 can be selectively fed into the suitable tank. Arranged in series with this developing station 35 are a gum resin coater 36 which applies a desensitizing film on the PS plate developed and a conveying table 37 from which the finished PS plate is transferred to an offset printing machine. Incorporated in the exposure station 31 and developing station 35 are respective timers (not shown) for controlling the time required for the corresponding treatments and thermoregulators for the developing agents stored in the respective tanks, these timers and thermoregulators being operatively connected to said output circuit in the output device 28. Thus, the output produced in the step C6 or D7 causes the output circuit to produce and apply corresponding control signals to said respective timers and thermoregulators in such a way as to effectuate optimum exposure and developing processing depending on the type of the PS plate employed. The processor 22, after producing said output for controlling the exposure and developing conditions, operates to drive the motor means MR for carrying the PS plate away from the detecting station 32, so that the apparatus is made ready for a subsequent identification procedure.

The above description and particulary the drawings are set forth for purposes of illustration only. It will be understood that many variations and modifications of the embodiments herein described will be obvious to those skilled in the art, and may be carried out without departing from the spirit and scope of the invention.

What is claimed is:

1. A method of identifying a presensitized offset printing plate with a photosensitive layer thereon comprising the steps of
   (a) scanning the photosensitive layer on said presensitized plate to be tested with a white light along a path;
   (b) detecting the light reflected from a plurality of spots along the scanned path in each of four color bands to derive a magenta signal, yellow signal, cyan signal and back-and-white signal;
   (c) measuring in said four color signals the intensity levels of the reflected light from respective spots on said scanned path to calculate mean values as well as variance values with respect to each of the four colors;
   (d) recognizing the calculated mean values and variance values as test data characteristic to said plate to be tested;
   (e) incorporating said test data into each of a plurality of sets of reference data to form corresponding numbers of groups, each set of reference data being composed of the intrinsic mean values and variance values obtained with respect to said four colors for each of a number of known plates having different light reflective characteristics;
   (f) calculating correlation ratios with respect to said four colors for each group so as to get the sum of the correlation ratios therefor; and
   (g) comparing the sum of the correlation ratios among said groups to find the group having a minimum value of said sum such that the test data is determined to be substantially identical to the particular reference data which forms with the test data said group having the minimum value and therefore that the plate to be tested is identified as one of the reference plates.

2. An apparatus for identifying a presensitized offset printing plate with a photosensitive layer thereon comprising
   (a) a tray for receiving the presensitized plate to be tested;
   (b) a measuring head having a white light emitting source and four detecting means for detecting the respective intensity levels of the light reflected by the photosensitive layer in each of four color bands for deriving a black-and-white signal, cyan signal, magneta signal and yellow signal, said measuring head moving relative to the presensitized plate such that said individual intensity levels of the reflected light in said four color bands are detected from a plurality of spots along a scanned path on the photosensitive layer;
   (c) computing means having calculating means, comparing means and data memory means, said calculating means calculating mean values as well as variance values with respect to said four colors from said intensity levels measured from the respective spots along the scanned path so as to present test data characteristic of the plate under, said data memory means storing a plurality of sets of reference data, each set of said reference data is composed of the intrinsic mean values and variance values which have been obtained with respect to said four colors for each of a plurality of known plates of different light reflective characteristics, and said calculating means incorporates for incorporating said test data into each of a plurality of sets of reference data to form corresponding numbers of groups, and calculating correlation ratios with respect to said four colors for each group so as to get the sum of the correlation ratios therefor, and said comparing means for comparing the sum of the correlation ratios among said groups to fing the group having a minimum value of said sum such that the test data may be determined to be substantially identical to the particular reference data which forms with the test data said group having the minimum value whereby the plate under test is identified as one of the reference plates;
   (d) data input means for storing the reference data intrinsic to a known presensitized plate in said data memory means, said data input means having first and second data input functions, such that in said first data input function the reference data are inputted to the data memory means in the form of numerals and in said second data input function the reference data are inputted to the data memory means by the use of said measuring operation of said measuring head;

(e) name input means for designating the reference data entered in the data memory means; and (f) an output device for indicating the content of the reference data obtained by said computing means as well as the names designated with said name input means.

* * * * *